(12) United States Patent
Yasuda et al.

(10) Patent No.: US 8,443,649 B2
(45) Date of Patent: May 21, 2013

(54) MASS FLOW CONTROLLER VERIFYING SYSTEM, VERIFYING METHOD AND VERIFYING PROGRAM

(75) Inventors: Tadahiro Yasuda, Kyoto (JP); Yuji Yamaguchi, Kyoto (JP)

(73) Assignee: Horiba STEC, Co., Ltd., Kyoto-shi (JP)

( * ) Notice: Subject to any disclaimer, the term of this patent is extended or adjusted under 35 U.S.C. 154(b) by 585 days.

(21) Appl. No.: 12/721,433

(22) Filed: Mar. 10, 2010

(65) Prior Publication Data
US 2010/0229967 A1   Sep. 16, 2010

(30) Foreign Application Priority Data
Mar. 11, 2009   (JP) ................... 2009-058780

(51) Int. Cl.
*G01F 25/00* (2006.01)
*G05B 23/00* (2006.01)
*G05B 23/02* (2006.01)

(52) U.S. Cl.
CPC ............ *G01F 25/00* (2013.01); *G01F 25/0038* (2013.01); *G01F 25/0053* (2013.01); *G05B 23/00* (2013.01); *G05B 23/02* (2013.01)
USPC ................ 73/1.34; 73/1.35; 702/113

(58) Field of Classification Search
USPC ........... 73/1.34–1.36; 137/486–487; 702/100, 702/113–116
IPC ...... G01F 25/00,25/007, 25/0053; G05B 23/00, G05B 23/02, 23/0237
See application file for complete search history.

(56) References Cited

U.S. PATENT DOCUMENTS

| | | | |
|---|---|---|---|
| 7,366,621 B2 * | 4/2008 | Sprague | 702/45 |
| 7,461,549 B1 * | 12/2008 | Ding et al. | |
| 7,891,228 B2 * | 2/2011 | Ding et al. | |
| 8,307,845 B2 * | 11/2012 | Kouchi et al. | 137/486 |
| 8,340,827 B2 * | 12/2012 | Yun et al. | 702/100 X |
| 2007/0240769 A1 * | 10/2007 | Suzuki et al. | 137/487.5 |
| 2007/0288125 A1 * | 12/2007 | Quaratiello | 700/282 |
| 2008/0255787 A1 * | 10/2008 | Sullivan et al. | 702/87 |
| 2009/0063059 A1 * | 3/2009 | Nakada et al. | 702/47 |
| 2009/0112504 A1 * | 4/2009 | Ding et al. | 702/100 |
| 2009/0266139 A1 * | 10/2009 | Gregor et al. | |
| 2011/0022334 A1 * | 1/2011 | Ding et al. | |
| 2011/0265549 A1 * | 11/2011 | Cruse et al. | |

FOREIGN PATENT DOCUMENTS

| | | | | |
|---|---|---|---|---|
| DE | 3236815 A1 | * | 4/1984 | 417/540 |
| JP | 09184600 A | * | 7/1997 | |
| JP | 2007-525726 | | 9/2007 | |
| WO | WO 2005006390 A2 | * | 1/2005 | |
| WO | WO 2006104640 A1 | * | 10/2006 | |
| WO | WO 2006127632 A2 | * | 11/2006 | |
| WO | WO 2008014076 A2 | * | 1/2008 | |
| WO | WO 2008064044 A1 | * | 5/2008 | |

* cited by examiner

*Primary Examiner* — Thomas P Noland
(74) *Attorney, Agent, or Firm* — Alleman Hall McCoy Russell & Tuttle LLP

(57) ABSTRACT

In a mass flow controller verifying system, there are provided a verifying gas line arranged in parallel to influent flow gas lines and joined into a post-confluent flow gas line, a reference volume calculating portion adapted to calculate a reference volume determined for a specified piping of a gas piping system, a verifying parameter calculating portion adapted to calculate a verifying parameter based on time series data of a measurement pressure measured by a pressure measurement unit during a control of a flow rate by a mass flow controller to be verified, and a comparing portion adapted to compare a reference parameter set based on the reference volume and the verifying parameter, whereby the verifying system can be introduced into an existing gas piping system used in a semi-conductor manufacturing process and so forth at a low cost and is capable of verifying a mass flow controller quickly and accurately.

4 Claims, 8 Drawing Sheets (a)

(b)

MASS FLOW CONTROLLER VERIFYING SYSTEM, VERIFYING METHOD AND VERIFYING PROGRAM

BACKGROUND OF THE INVENTION

1. Field of the Invention

The present invention generally relates to a mass flow controller verifying system, and in particular to a method of verifying a mass flow controller in a gas piping system having a plurality of influent flow gas lines including mass flow controllers arranged in parallel, wherein the influent flow gas lines are joined together to form one post-confluent flow gas line.

2. Description of the Background Art

In order to supply a mixed gas to a process chamber in a process of manufacturing a semiconductor and the like, there is constituted a gas piping system that comprises a plurality of influent flow gas lines arranged in parallel, each having a mass flow controller, the influent flow gas lines being connected to a gas supply source and the influent flow gas lines being joined together to form one post-confluent flow gas line connected to the process chamber.

In a gas piping system as mentioned above, Patent Literature 1 (reference JP2007-525726A) discloses a diagnostic system for verifying whether or not a mass flow controller provided on each of the influent flow gas lines can execute a flow rate control accurately, as defined to be in conformity with a preset flow rate.

In this system, as shown in FIG. 1, a branch flow line BL is formed to be connected in parallel to a post-confluent flow gas line ML, a large-capacity chamber A1 having a prescribed volume is provided on the branch flow line BL, and a pressure sensor A2 is provided on a downstream side thereof. Thus, the verifying of the mass flow controller 1 is performed based on a pressure measured by the pressure sensor A2. Further, in the post-confluent flow gas line ML, there are provided open-close (opening/closing) valves between the connecting points of the branch flow line BL and in the vicinities of the inlet and outlet of the branch flow line BL, respectively.

By this verifying system A100, a mass flow controller verifying method referred to as a rate of rise (ROR) system is used. Referring to a verifying procedure thereof specifically, when a mass flow controller is verified, only an open-close valve on the inlet side of the branch flow line is opened while the other valves are closed, and the influent gas lines SL, except for an influent flow gas line SL having a target mass flow controller 1 to be verified, are also closed. Then, a prescribed set flow rate is set to the target mass flow controller 1 to be verified so as to introduce a gas into the chamber and increase the pressure. Meanwhile, the change in pressure is measured by the pressure sensor, and a verifying volume corresponding to the volume of the chamber A1 is calculated based on the rate of pressure change. Subsequently, the calculated verifying volume is compared to a reference volume that is a sum of the prescribed known chamber volume and an approximate rough volume of a piping portion from the target mass flow controller to the chamber. In this comparison, when the calculated verifying volume is equal to the reference volume, it is judged that the mass flow controller can execute a flow rate control as defined to be in conformity with the set flow rate. When the calculated verifying volume is not equal to the reference volume, it is judged that the mass flow controller cannot execute a flow rate control as defined to be in conformity with the set flow rate due to clogging and so forth.

However, in the mass flow controller verifying system as disclosed in Patent Literature 1, some problems are involved as described below.

In order to introduce this verifying system into an existing gas piping system for use in a semiconductor manufacturing process and so forth, it is necessary to newly constitute piping, such as a branch flow line connected to a post-confluent piping, and to provide a chamber for obtaining a reference volume. In some cases, however, it may be difficult to newly provide an additional piping and chamber due to a layout of a factory and the like, and due to the resulting increased costs for designing the piping for the verifying system to fit to the existing piping system and installing of the new piping and chamber.

In order to verify a mass flow controller accurately according to the methods of an ROR system and the like, it is necessary to confirm the reference volume correctly. In this verifying system, the sum of the piping volume in a region from a target mass flow controller to be verified to the chamber and the known volume of the chamber is used as the reference volume, and the piping volume is usually roughly calculated based on, e.g., a length of the corresponding piping. However, it is difficult to accurately calculate a volume of a curved portion of a piping and a volume inside an open-close valve and so forth, and therefore the calculated value of the reference volume is not very reliable. Moreover, if it is intended to be able to absorb an error related to such a piping volume, the volume of the chamber should be increased to a certain extent.

If the volume of the chamber is increased to be large or the reference volume is large, an amount of a pressure change required for verifying cannot be measured without a necessary long time lapse. Therefore, it takes a long time to verify each of the mass flow controllers.

SUMMARY OF THE INVENTION

The present invention has been made to solve the above problems, and therefore an object of the present invention is to provide a verifying system that can be introduced into an existing gas piping system used in a semiconductor manufacturing process and so forth at a low cost without any change in designing a piping and the like, and that is capable of verifying a mass flow controller based on an accurate reference volume in a short time.

Accordingly, a first aspect of the present invention provides a mass flow controller verifying system for use in a gas piping system provided with one or a plurality of influent flow gas lines each having a mass flow controller and provided with a post-confluent flow gas line into which a plurality of gas lines including the influent flow gas lines are joined wherein the post-confluent flow gas line is provided with a post-confluent valve thereon after the confluence of the plurality of gas lines. The verifying system comprises: a verifying gas line provided with a flow rate measurement unit adapted to measure a flow rate of a gas, a flow rate adjustable valve by which an opening degree thereof is adjusted so that the measurement flow rate measured by the flow rate measurement unit is coincident with a set flow rate, and a pressure measurement unit adapted to measure a gas pressure, wherein the verifying gas line is arranged in parallel to the influent flow gas lines and joined into the post-confluent flow gas line; a reference volume calculating portion adapted to calculate a reference volume based on time series data of a measurement pressure measured by the pressure measurement unit, wherein the reference volume is a volume inside a piping portion determined by the flow rate adjustable valve, a closing position of each of the influent gas lines and the post-confluent valve, in a state that each of the influent gas lines is closed and the post-confluent valve is closed; a verifying parameter calculating portion adapted to calculate a verifying parameter based on the time series data of the measurement pressure measured by the pressure measurement unit in a state that the influent gas lines, except for an influent gas line having a target mass flow controller to be verified, are closed at the same position as the closing position in the calculation of the reference volume and that the adjustable valve and the post-confluent valve are closed; and a comparing portion adapted to compare a reference parameter set based on the reference volume and the verifying parameter.

A second aspect of the present invention provides a mass flow controller verifying method for use in a gas piping system provided with one or a plurality of influent flow gas lines each having a mass flow controller and provided with a post-confluent flow gas line into which a plurality of gas lines including the influent flow gas lines are joined wherein the post-confluent flow gas line is provided with a post-confluent valve thereon after the confluence of the gas lines. The verifying method comprises: a step of installing a verifying gas line arranged in parallel to the influent flow gas lines and joined into the post-confluent flow gas line, wherein the verifying gas line is provided with a flow rate measurement unit adapted to measure a flow rate of a gas flowing through the verifying gas line, a flow rate adjustable valve by which an opening degree thereof is adjusted so that the measurement flow rate measured by the flow rate measurement unit is coincident with a set flow rate, and a pressure measurement unit adapted to measure a gas pressure in the verifying gas line; a step of calculating a reference volume based on time series data of a measurement pressure measured by the pressure measurement unit, wherein the reference volume is a volume inside a piping portion determined by the flow rate adjustable valve, a closing position of each of the influent gas lines and the post-confluent valve, in a state that each of the influent gas lines is closed and the post-confluent valve is closed; a step of calculating a verifying parameter based on the time series data of the measurement pressure measured by the pressure measurement unit in a state that the influent gas lines, except for an influent gas line having a target mass flow controller to be verified, are closed at the same position as the closing position in the calculation of the reference volume and that the adjustable valve and the post-confluent valve are closed; and a step of comparing a reference parameter set based on the reference volume and the verifying parameter.

A third aspect of the present invention provides a computer readable program for use in verifying a mass flow controller in a gas piping system provided with one or a plurality of influent flow gas lines each having a mass flow controller and provided with a verifying gas line in parallel to the influent flow gas lines, wherein the verifying gas line is provided with a flow rate measurement unit adapted to measure a flow rate of a gas, a flow rate adjustable valve by which an opening degree thereof is adjusted so that the measurement flow rate measured by the flow rate measurement unit is coincident with a set flow rate, and a pressure measurement unit adapted to measure a gas pressure, wherein a post-confluent flow gas line located after the confluence of each of the influent gas lines and the verifying gas line is provided with a post-confluent valve thereon. The computer readable program executes the processes of: calculating a reference volume based on time series data of a measurement pressure measured by the pressure measurement unit, wherein the reference volume is a volume inside a piping portion determined by the flow rate adjustable valve, a closing position of each of the influent gas lines and the post-confluent valve, in a state that each of the influent gas lines is closed and the post-confluent valve is closed; setting a set flow rate to a target mass flow controller to be verified and to calculate a verifying parameter based on the time series data of the measurement pressure measured by the pressure measurement unit during the flow rate control executed by the target mass flow controller to be verified in a state that the influent gas lines, except for an influent gas line having a target mass flow controller to be verified, are closed at the same position as the closing position in the calculation of the reference volume and that the adjustable valve and the post-confluent valve are closed; and comparing a reference parameter set based on the reference volume and the verifying parameter.

According to these aspects of the present invention, in an existing gas piping system for use in a semiconductor manufacturing process and so forth, for example, one of the influent flow gas lines can be replaced by a verifying gas line by providing the flow rate measurement unit, the flow rate adjustable valve and the pressure measurement unit thereon. Therefore, the cost of introducing the verifying system can be remarkably reduced since it is not necessary to newly design or install an additional piping. Further, since the volume inside the piping determined by the flow rate adjustable valve, the closing position of each influent flow gas line and the post-confluent valve can be calculated by the reference volume calculation means and the calculated volume can be used as the reference volume, it is not necessary to newly provide a chamber and the like in the gas piping system for obtaining the reference volume as is used in the conventional system. In addition, the accuracy of the flow rate control and the accuracy of the pressure measurement in the verifying gas line can be made reliable, whereby the value of the reference volume can be correctly calculated to be used for verifying a mass flow controller. In other words, since a mass flow controller can be verified while self-verifying the reference volume, the comparing portion can compare the reference parameter determined based on the reliable reference volume to the verifying parameter, so that highly reliable verifying of a mass flow controller can be always performed.

Furthermore, since the volume inside the piping determined based on the flow rate adjustable valve, the closing position of each influent flow gas line and the post-confluent valve is used as the reference volume, a distance between the target mass flow controller to be verified and the reference volume can be minimized, and therefore a temperature of the gas can be prevented from changing and an influence on the verifying of the mass flow controller can be suppressed. Moreover, since the reference volume is constituted by a gas piping, a surface area to a volume can be increased compared to the case of using a chamber and so forth. Therefore, the temperature exchangeability of a gas can be improved and the measurement environment of a gas temperature and the like can be easily stabilized to be constant in every measurement.

In addition, since the reference volume is constituted by the gas piping, the reference volume can be made variable by using, e.g., an optional opening/closing valve provided on the post-confluent flow gas line as the post-confluent valve. In more specific, a volume including not only a piping but also a process chamber can be used as the reference volume to be used for verifying a mass flow controller, whereby the reference volume can be freely determined according to an object of verifying.

Conversely, since the reference volume can be measured based on the time series data of the pressure measurement value, a minimum requirement of the reference volume can be used and the pressure changing amount required for verifying can be produced within a limited time. That is, the verifying can be executed in a short time and such a change in pressure can be easily detected even in the case of verifying a mass flow controller of a small flow rate or even in the case of the flow rate being minutely varied.

Furthermore, there may be a possible case that one gas line is added to the existing gas piping system to be arranged in parallel to the influent flow gas lines so that the gas flowing therethrough is finally joined to the post-confluent flow gas line and the added gas line is used as the verifying gas line. Even in such a case, the reference volume can be calculated and the mass flow controller can be verified accurately, similarly to the case of providing a verifying gas line by replacement in an existing gas piping system.

In order to facilitate providing a verifying gas line in an existing gas piping system, it may be possible that the verifying gas line is provided with a differential mass flow controller including the flow rate measurement unit, the flow rate adjustable valve and the pressure measurement unit, and that the pressure measurement unit is used as the flow rate measurement unit.

For example, when a rate of fall (ROF) type mass flow controller including verifying system is verified, it may be realized by a mass flow controller verifying system for use in a gas piping system provided with one or a plurality of influent flow gas lines each having a mass flow controller and provided with a pre-diverting flow gas line into which gas lines including the influent flow gas lines are joined, wherein the pre-diverting flow gas line is provided with a pre-diverting valve thereon before the diversion of the gas lines. The verifying system comprises: a verifying gas line provided with a flow rate measurement unit adapted to measure a flow rate of a gas, a flow rate adjustable valve by which an opening degree thereof is adjusted so that the measurement flow rate measured by the flow rate measurement unit is coincident with a set flow rate, and a pressure measurement unit adapted to measure a gas pressure, wherein the verifying gas line is arranged in parallel to the influent flow gas lines and connected to the pre-diverting flow gas line; a reference volume calculating portion adapted to calculate a reference volume based on time series data of a measurement pressure measured by the pressure measurement unit, wherein the reference volume is a volume inside a piping portion determined by the flow rate adjustable valve, a closing position of each of the influent gas lines and the pre-diverting valve, in a state that each of the influent gas lines is closed and the pre-diverting valve is closed; a verifying parameter calculating portion adapted to calculate a verifying parameter based on the time series data of the measurement pressure measured by the pressure measurement unit in a state that the influent gas lines, except for an influent gas line having a target mass flow controller to be verified, are closed at the same position as the closing position in the calculation of the reference volume and the flow rate adjustable valve and the pre-diverting valve are closed; and a comparing portion adapted to compare a reference parameter set based on the reference volume and the verifying parameter. Such a verifying system can obtain an effect similar to that in the verifying system as described before.

As described above, according to the mass flow controller verifying system, verifying method and the program for use therein of the present invention, the verifying gas line can be constituted by providing the flow rate measurement unit, the flow rate adjustable valve and the pressure measurement unit onto one of the plurality of existing influent flow gas lines, whereby it becomes possible to verify a mass flow controller on each of the influent flow gas lines by a simple replacement or an addition of the verifying gas line as mentioned above. In addition, since the reference volume for use in verifying can be calculated from equipment on the influent flow gas lines, there is no need of additionally providing a reference volume. That is, since there is no need of designing or installing a new piping, a chamber, or the like in an existing gas piping system, an introduction cost can be suppressed. Moreover, since the reference volume is formed of the piping, the distance from a target mass flow controller to be verified is close thereto, and therefore a thermal influence on the verifying can be suppressed as small as possible. Furthermore, since the reference volume can be freely set by, for example, closing an optional opening/closing valve prepared in the existing gas piping system, it is also possible to set the reference volume every occasion according to an object, to minimize the volume as necessitated to thereby shorten the verifying time, and to facilitate detection of an abnormality by giving a large readout of a pressure change with a minute flow rate.

DETAILED DESCRIPTION OF THE PREFERRED EMBODIMENTS

Referring to the attached drawings, an embodiment of the present invention will be described below.

Figure 1:
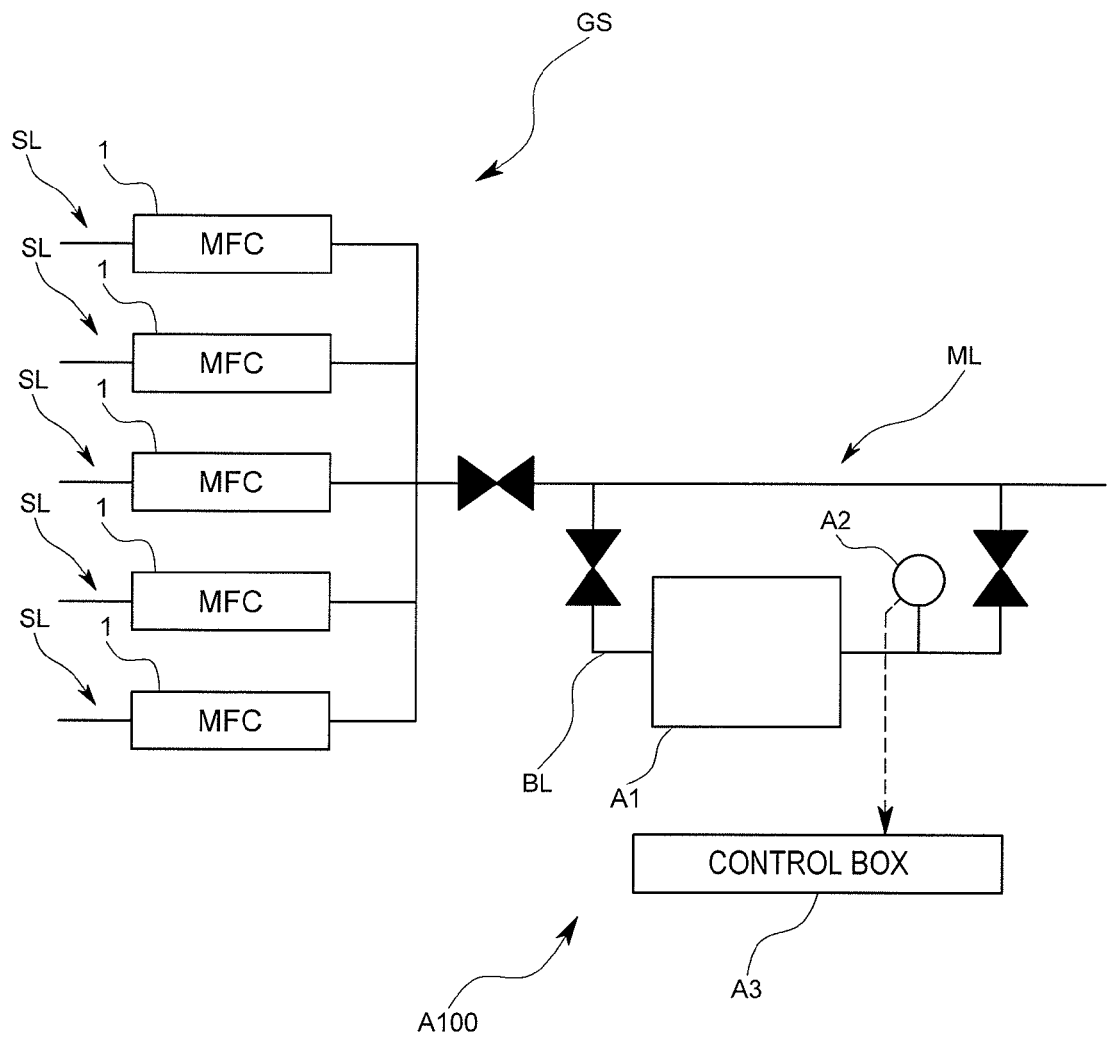
FIG. 1 is a schematic diagram showing a conventional verifying system of a mass flow controller.
Figure 2:
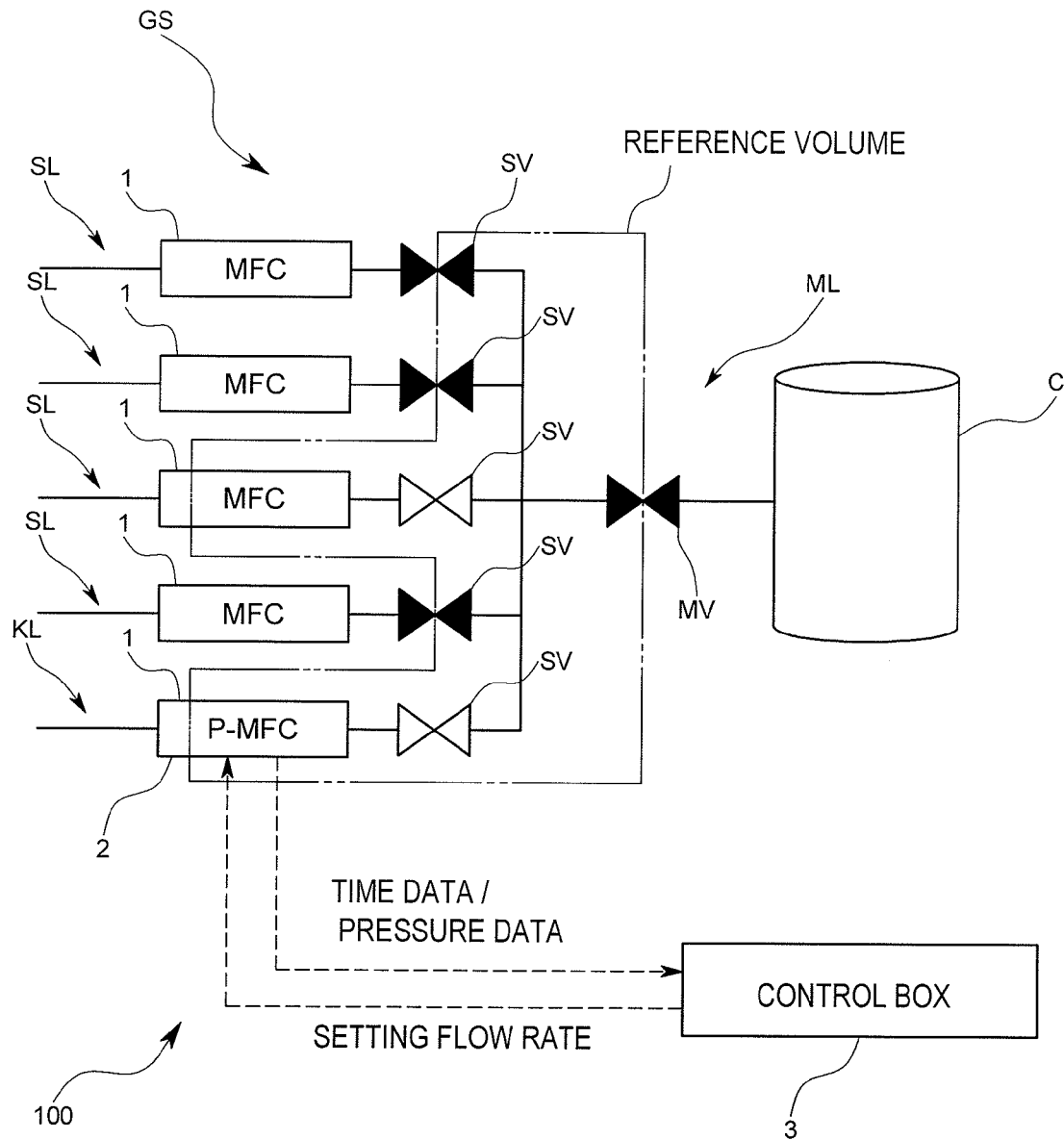
FIG. 2 is a schematic diagram showing a verifying system of a mass flow controller according to one embodiment of the present invention.
Figure 3:
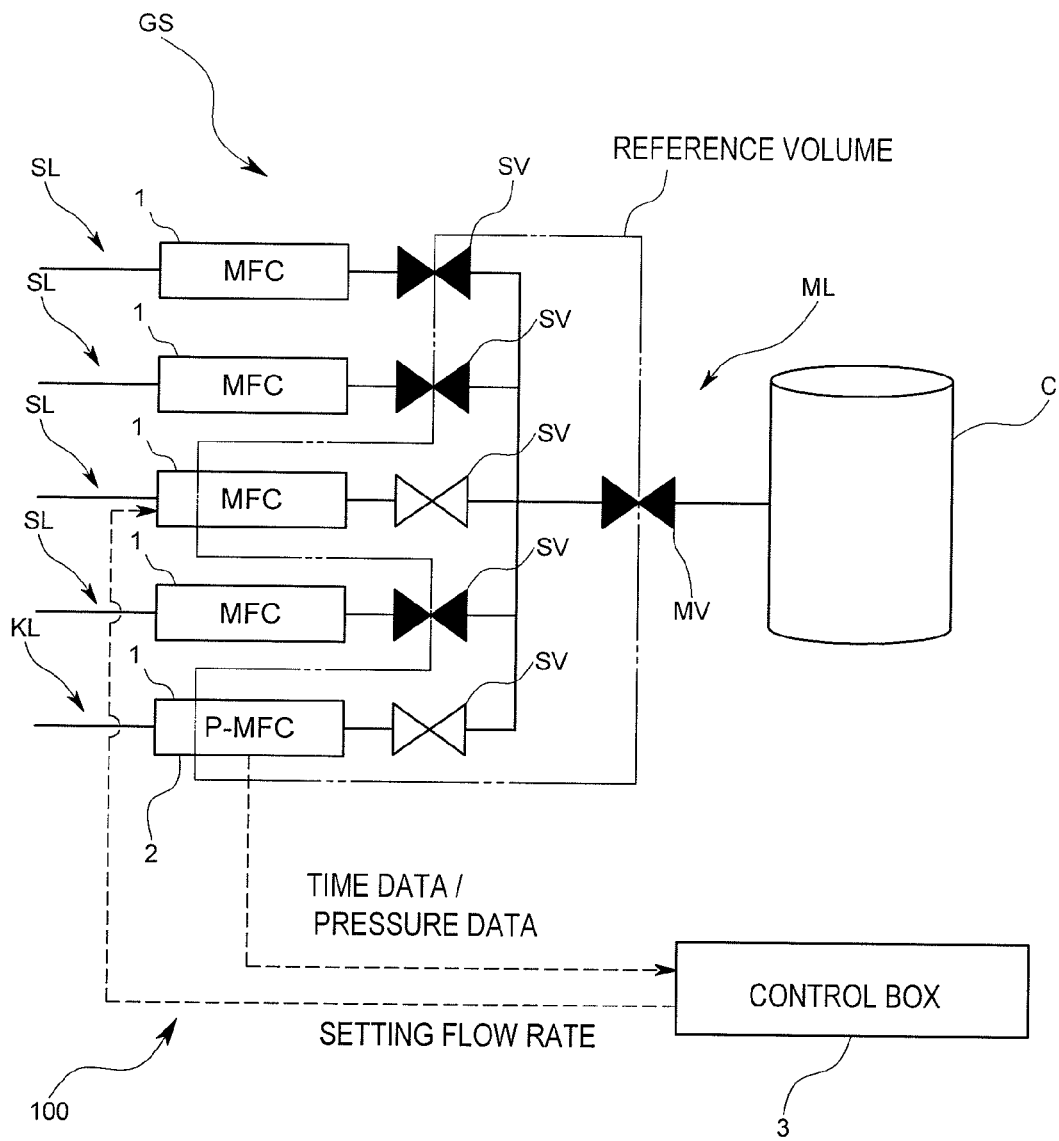
FIG. 3 is a schematic diagram showing a verifying system of a mass flow controller in the same embodiment.

A verifying system 100 for verifying a mass flow controller (MFC) 1 according to the present embodiment is used for individually verifying a plurality of mass flow controllers 1 provided in an existing gas piping system GS for supplying various kinds of gases from a plurality of gas cylinders (not shown) serving as gas supply means to a process chamber C in a semiconductor manufacturing process and so forth as shown in FIGS. 2 and 3. This gas piping system GS includes a gas box that is provided with a plurality of influent flow gas lines SL in parallel, each of which is connected to the gas cylinder and includes at least the mass flow controller 1 and a secondary side opening/closing valve SV on a downstream of the controller 1, and a post-confluent flow gas line ML that is a gas line formed after the influent flow gas lines SL are joined into one and that includes a post-confluent opening/closing valve MV, a downstream side of which is connected to the process chamber C. It is noted here that the post-confluent opening/closing valve MV may be provided at any location on the post-confluent flow gas line ML after the influent flow gas lines SL are joined. For example, a valve provided in a gas panel and the like detachably attaching between the process chamber C and the gas piping system GS may be used as the post-confluent valve. It is noted here that, the phrase "provided . . . in parallel" means a manner of installing independent gas lines being fluidically joined together at respective ends thereof, or a manner of diverting a plurality of independent gas lines from one gas line.

As shown in FIGS. 2 and 3, the verifying system 100 includes: a verifying gas line KL configured by substituting a reference differential mass flow controller 2 for one mass flow controller 1 among the influent flow gas lines SL in the gas piping system GS; and a control box 3 for obtaining various measurement information from the differential controller 2 and the mass flow controllers 1 on the influent flow gas lines SL, and for setting a flow rate.

Figure 4:
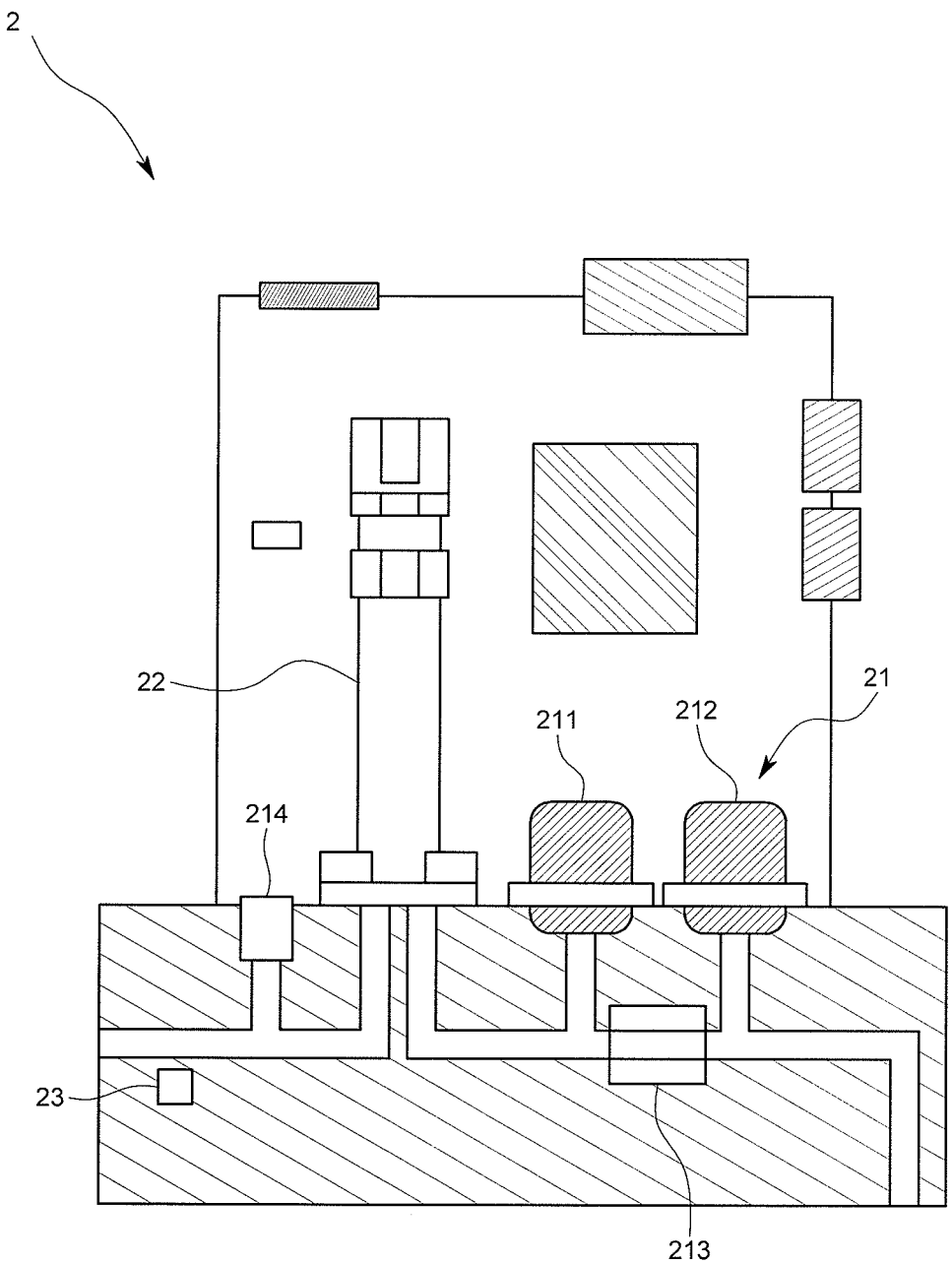
FIG. 4 is a schematic section view showing a differential mass flow controller in the same embodiment.

The differential mass flow controller 2 is provided with a flow rate adjustable valve 22 and a flow rate measurement unit 21 for measuring a flow rate based on a differential pressure of a gas flowing through a flow path, from the upstream in this order, as shown in FIG. 4.

The opening degree of the flow rate adjustable valve 22 is controlled in a manner such that the measurement flow rate of the gas flowing through the verifying gas line KL measured by the flow rate measurement unit 21 is adjusted to be coincident with a set value of a flow rate.

The flow rate measurement unit 21 is composed of a first pressure sensor 211, a resistance element 213 and a second pressure sensor 212 arranged in this order from upstream, thereby measuring a mass flow rate of a fluid based on a change in pressure of the fluid before and after the resistance element 213. Herein, the measurement accuracy of the second pressure sensor 212 is higher than that of the first pressure sensor 211 and the second pressure sensor 212 corresponds to the pressure measurement unit set forth in Claims.

This differential mass flow controller 2 is provided with a temperature sensor 23 inside a block body having an internal flow path formed therein so as to measure a temperature of the gas flowing through the flow path inside the differential mass flow controller 2 and compensate the temperature of the measured flow rate. Further, there is provided a front-stage pressure sensor 214 in the upstream of the flow rate adjustable valve 22 to be used in the case of executing a ROF type verifying as to be described later.

Figure 5:
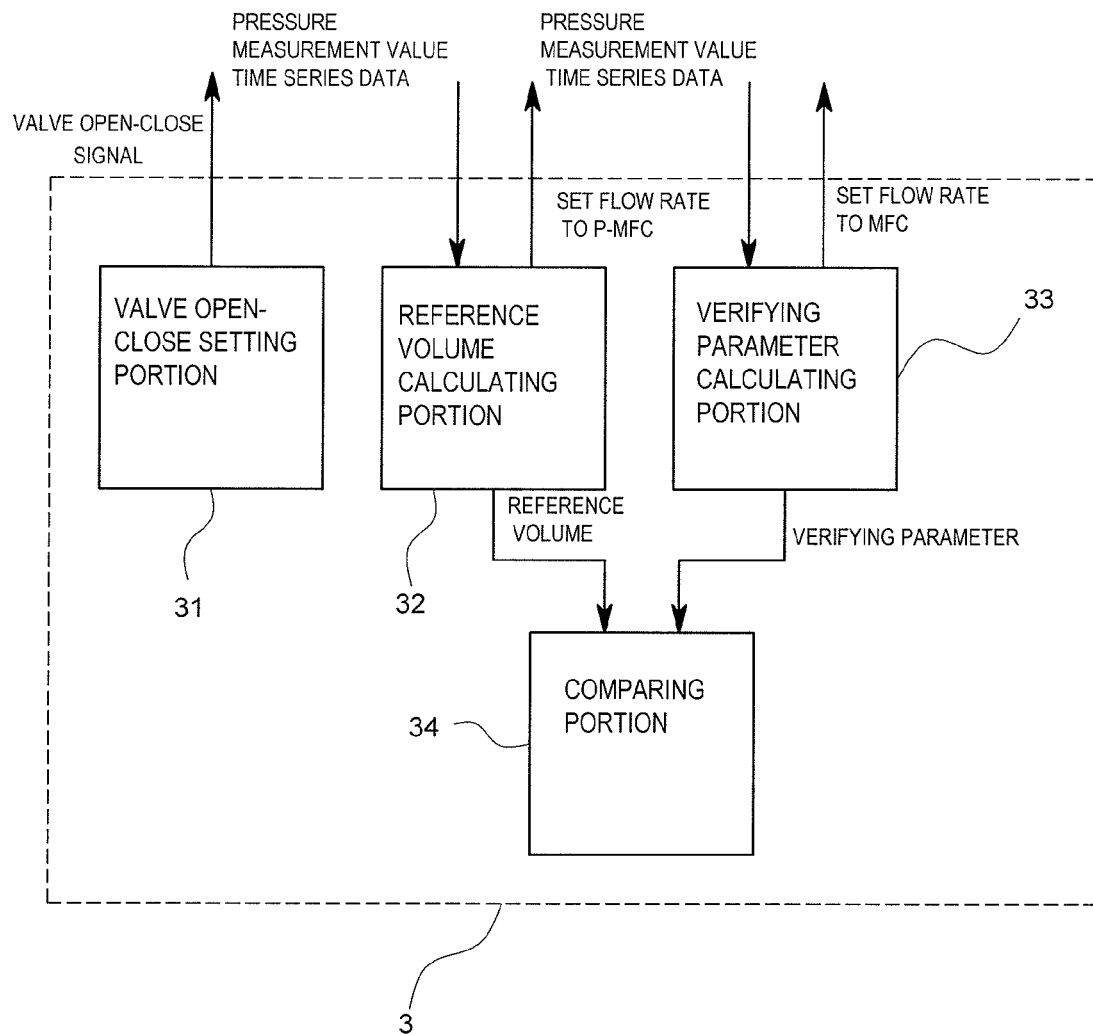
FIG. 5 is a schematic diagram showing functional blocks of a control box in the same embodiment.

The control box 3 is implemented by a so-called computer that includes a processor, a memory, an I/O channel, an output equipment such as a display and so forth, an input equipment such as a keyboard, an A/D converter and the like, wherein the processor and the peripheral equipment thereof are operable in accordance with a program stored in the memory, thereby functioning as at least a valve open-close setting portion 31, a reference volume calculating portion 32, a verifying parameter calculating portion 33, and a comparing portion 34 as shown in the functioning block diagram of FIG. 5. Moreover, the control box 3 is electrically connected to each of the mass flow controllers 1 and the differential mass flow controller 2 so as to set a set flow rate in each of the mass flow controllers 1 and to obtain time series data that is a set of the measurement pressure measured by the second pressure sensor 212 of the differential mass flow controller 2 and the measurement time thereof.

Each component of the control box 3 will be described below.

The valve open-close setting portion 31 sets the opening/closing operations of the secondary side open-close valve SV, the post-confluent valve MV, the flow rate adjustable valve 22 and the valve inside the verify-targeted mass flow controller 1 to be verified in order to determine the volume of the gas piping to be used as the reference volume.

The reference volume calculating portion 32 calculates the reference volume in a state that, the valve open-close setting portion 31 opens the secondary side open-close valve SV on the influent flow gas line SL having the verify-targeted mass flow controller 1 provided thereon, closes the valve inside the verify-targeted mass flow controller 1, closes the secondary side open-close valves SV on the other influent flow gas lines SL and closes the post-confluent valve MV. It should noted here that, the reference volume corresponds to the piping volume of the gas piping system GS determined for each closed secondary side open-close valve SV, the post-confluent valve MV, the valve inside the verify-targeted mass flow controller 1 and the flow rate adjustable valve 22 inside the differential mass flow controller 1. In other words, the reference volume means a space generally closed by the valves and so forth inside the piping, and indicates a space in which the pressure is changed by admission of a gas flow thereto. Note that, the piping volume like this is referred to as the reference volume in the following description, except where specifically noted. More specifically, the reference volume calculating portion 32 is so constructed as to calculate the reference volume based on the time series data of the measurement pressure measured by the second pressure sensor 212 while the set flow rate being determined by the differential mass flow controller 2 on the verifying gas line and the flow rate being controlled by the flow rate adjustable valve 22.

Figure 6:
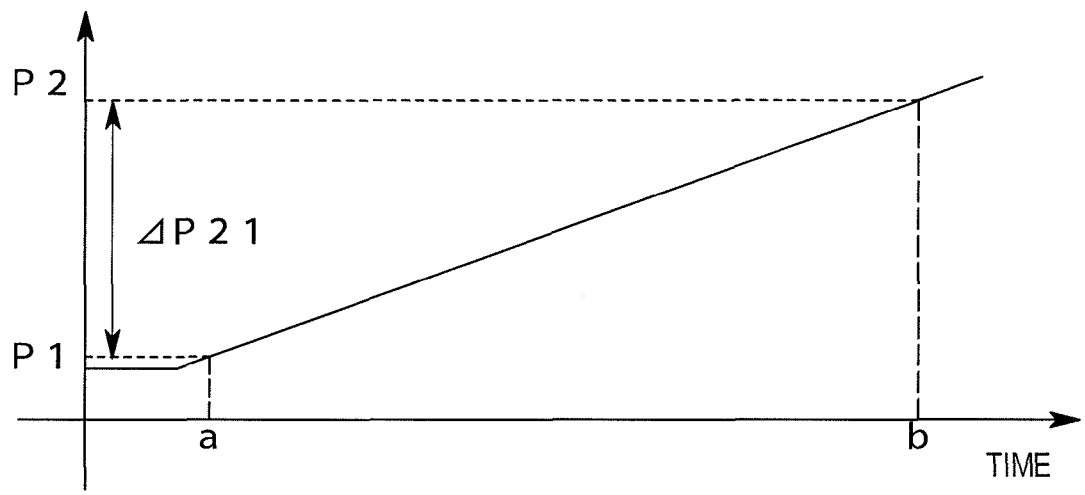
FIG. 6(a) is a graph showing a concept of a ROR type verifying in the same embodiment.
FIG. 6(b) is a graph showing a concept of a ROR type verifying in the same embodiment.
Figure 6:
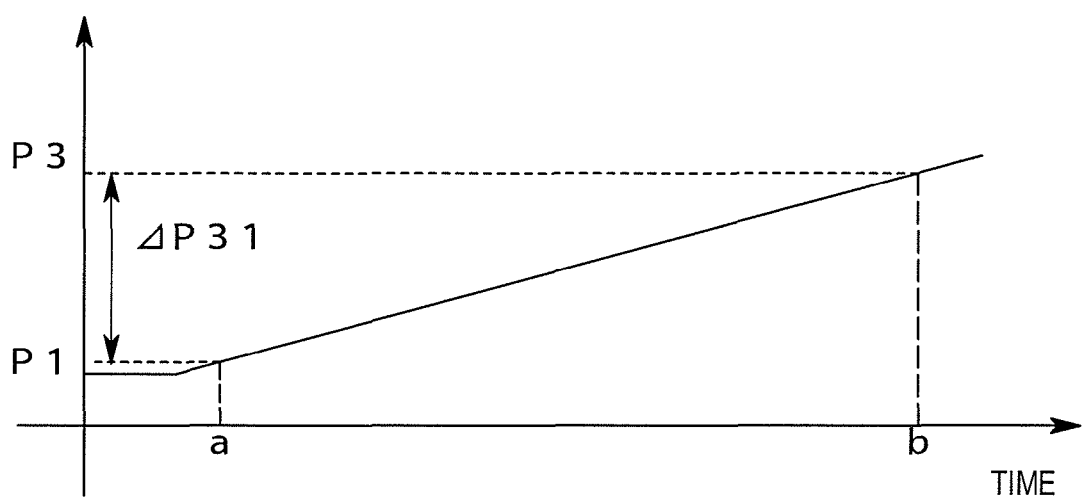

Referring to the calculation of this reference volume in detail, the reference volume calculating portion 32 sets as a trigger the set flow rate that is defined in the differential mass flow controller 2, and thereafter obtains an increased amount ΔP of the pressure value in a period, for example, from a timing of the pressure measured by the second pressure sensor 212 being the first pressure value P1 to a timing of being the second pressure value P2 after a first predetermined time lapse. In the case shown in FIG. 6(a), for example, there is obtained an increased pressure amount $\Delta P_{21}$ of the second pressure sensor 212 in an interval a-b.

Subsequently, the reference volume calculating portion 32 calculates the reference volume by substituting, into an equation of state (EOS) of a gas (Eq. (1)), an integral of a mass flow rate calculated based on the time series data of the mass flow rate measured in the interval a-b and the increased pressure amount $\Delta P_{21}$.

$$V = nRT/\Delta P_{21} \qquad (1)$$

Herein, n is a number of moles (an integral of a mass per a unit time (mass flow rate) with time, that is a mass flow rate integral), R is a gas constant (known from a gas to be controlled), T is a temperature (known from an output of the temperature sensor 236 and so forth), and $\Delta P_{21}$ is an increased pressure amount in the second pressure sensor 212.

The verifying parameter calculating portion 33 is adapted to calculate a verifying parameter in a state that, the valve open-close setting portion 31 closes the secondary side open-close valve SV on the influent flow gas lines SL except for the influent flow gas line SL having a verify-targeted mass flow controller 1 thereon, closes the post-confluent valve MV and closes the flow rate adjustable valve 22 inside the differential mass flow controller 2. Specifically, the verifying parameter calculating portion 33 is so constructed as to define the set flow rate for the verify-targeted mass flow controller 1 and calculate the verifying parameter based on the time series data of the measurement pressure measured by the pressure measurement unit during a period of executing a flow rate control by the verify-targeted mass flow controller 1.

Referring to the calculation of the verifying parameter in detail, the verifying parameter calculating portion 33 sets as a trigger the set flow rate that is defined in the verify-targeted mass flow controller 1, and thereafter obtains an increased amount ΔP2 of the pressure value in a period from a timing of the pressure measured by the second pressure sensor 212 being the same first pressure value P1 used in the reference volume calculating portion 32 to a timing of being the third pressure value P3 after the first predetermined time lapse. In the case shown in FIG. 6(b), for example, there is obtained an increased pressure amount $\Delta P_{31}$ of the second pressure sensor 212 in an interval a-b.

Subsequently, the verifying parameter calculating portion 33 calculates a verifying volume $V_{test}$ as the verifying parameter by substituting, into an equation of state (EOS) of a gas (Eq. (2)), an integral of a mass flow rate calculated based on the defined set flow rate and the time lapse in the interval a-b and the increased pressure amount $\Delta P_{31}$.

$$V_{test} = nRT/\Delta P_{31} \tag{2}$$

Herein, n is a number of moles (an integral of a mass per a unit time (mass flow rate) with time, that is a mass flow rate integral), R is a gas constant (known from a gas to be controlled), T is a temperature (known from an output of the temperature sensor 236 and so forth), and $\Delta P_{31}$ is an increased pressure amount in the second pressure sensor 212.

The comparing portion 34 is adapted to compare the reference volume to the calculated verifying volume $V_{test}$ as the verifying parameter, and when these volumes are coincident with or in a prescribed range, it is determined that the verified mass flow controller 1 is normal, while when these volumes are not coincident with or beyond a prescribed range, it is determined that there exists an abnormality in the verified mass flow controller 1, and this fact is displayed. It is noted here that, although the reference volume per se is used as the verifying parameter in the present embodiment, a parameter or a verifying curve may be determined based on the reference volume in another embodiment which will be described later.

Figure 7:
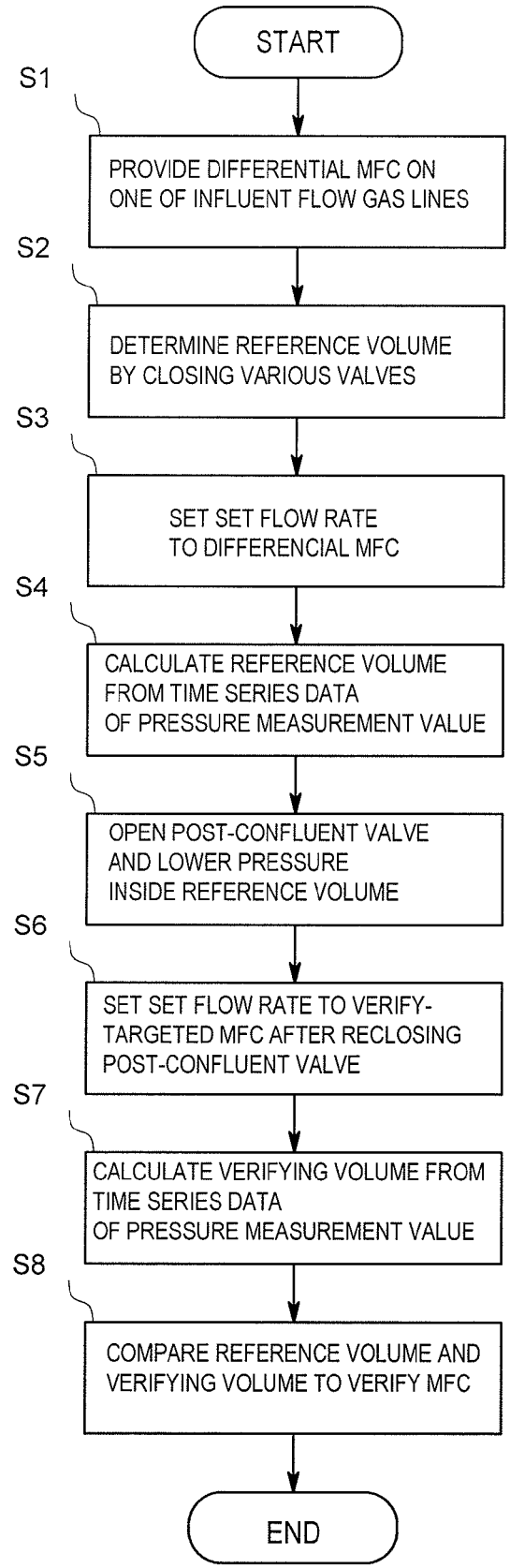
FIG. 7 is a flow chart showing a verifying flow of a mass flow controller in the same embodiment.

A procedure of a verifying method in the verifying system 100 of the mass flow controller 1 constructed as above will be explained below with reference to a flow chart shown in FIG. 7.

First, a reference differential mass flow controller 2 is provided on one of the influent flow gas lines SL in the existing gas piping system GS to serve as a verifying gas line KL, and each of the mass flow controllers 1 and the differential mass flow controller 2 are both connected to the control box 3, thereby setting up the gas piping system to be able to set a flow rate and obtain the time and pressure data thereof (Step S1).

Subsequently, the various kinds of valves are closed by the valve open-close setting portion 31 so that the reference volume is determined by the gas piping per se (Step S2). Herein, the verify-targeted mass flow controller 1 is totally closed so that the differential mass flow controller 2 can control the flow rate.

Then, the reference volume calculating portion 32 sets the set flow rate to the differential mass flow controller 2 (Step S3), and calculates the reference volume by substituting the value calculated from the time series data of the pressure measurement value measured by the second pressure sensor 212 and the mass flow rate calculated from the pressure difference between the first pressure sensor 211 and the second pressure sensor 212, into an equation of state (EOS) of a gas (Step S4).

Subsequently, the valve open-close setting portion 31 opens the post-confluent valve MV to reduce the pressure inside the reference volume and thereafter closes the post-confluent valve MV again. The flow rate adjustable valve 22 of the differential mass flow controller 2 is closed so that the verify-targeted mass flow controller 1 is settled in a state of being able to control the flow rate (Step S5).

Then, the verifying parameter calculating portion 33 sets the set flow rate to the verify-targeted mass flow controller 1 (Step S6), and calculates the verifying volume by an equation of state (EOS) of a gas, wherein the calculated verifying volume is a value of the reference volume based on the time series data of the pressure measurement value measured by the second pressure sensor 212 and the set flow rate (Step S7).

Finally, the comparing portion 34 compares the reference volume and the calculated verifying volume, thereby judging whether or not the verify-targeted mass flow controller 1 is normally operated (Step S8).

As described above, according to the mass flow controller 1 of the present embodiment, the verifying gas line KL is obtained by merely providing the differential mass flow controller 2 on one of the influent flow gas lines SL in the existing gas piping system GS, whereby it becomes possible to constitute the ROR type verifying system 100 of the mass flow controller 1. Accordingly, there is no need of, e.g., designing and installing a new flow path or chamber in the post-confluent piping in order to introduce the ROR type verifying system 100 into the gas piping system as in the conventional system, and therefore the introduction cost can be remarkably reduced.

Moreover, since the volume within the piping portion determined by the secondary side open-close valve SV and the post-confluent valve MV is used as the reference volume, the distance between the verify-targeted mass flow controller 1 and the reference volume can be minimized. Accordingly, the temperature of the gas can be prevented from changing and an influence on the verifying of the mass flow controller 1 can be reduced. In addition, since the reference volume is formed by the gas piping, the surface area with respect to the volume can be increased compared to the case of using a chamber and so forth. Therefore, the temperature exchangeability of a gas can be improved and the measurement environment of a gas temperature and the like can be easily stabilized to be constant in every measurement.

Further, since the reference volume is formed of the gas piping per se by appropriately closing the various kinds of valves on the gas piping, the reference volume can be minimized and the mass flow controller including the flow path to the process chamber C can be verified by, e.g., appropriately selecting which of the existing post-confluent valve be switched off.

For example, by reducing the reference volume to the minimal limit, the pressure change inside the reference volume can be made large in a short time period even in the case where the controllable flow rate of the mass flow controller 1 is small, and therefore an accurate verifying can be executed even with a small flow rate.

In addition, although the reference volume is roughly obtained and not very reliable in a conventional system, since the value of the reference volume can be self-verified by the differential mass flow controller 2, the mass flow controller can be verified based on the more accurate value. Accordingly, the reliability of the verifying per se of the mass flow controller 1 can be improved.

Figure 8:
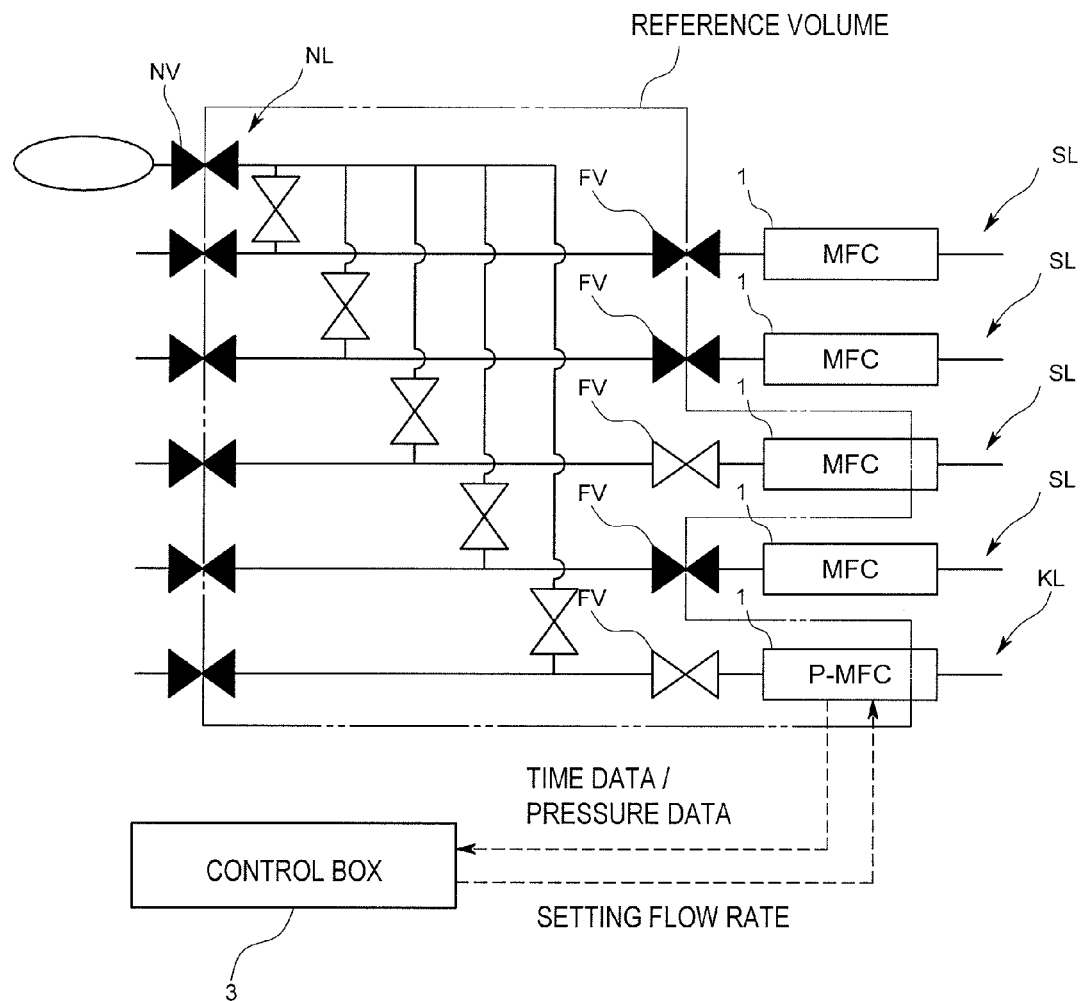
FIG. 8 is a schematic diagram, showing a verifying system of a mass flow controller according to another embodiment of the present invention.

The following describes another embodiment of the present invention with reference to FIG. 8.

As shown in FIG. 8, the present invention can be also adapted to a gas piping system GS provided with a plurality of influent flow gas lines SL in parallel each having a mass flow controller 1 and provided with a pre-diverting flow gas lines each having a pre-diverting valve thereon before diversion of each of the influent flow gas lines SL. More specifically, it may be constructed that a verifying gas line KL provided with a differential mass flow controller 2 is arranged in parallel to the influent flow gas lines SL and the inlet side thereof is connected to the pre-diverting flow gas line NL.

Even in this configuration, the volume of the piping portion determined by the pre-diverting valve on the pre-diverting flow gas line and a primary side valve FV provided in the upstream of the mass flow controller 1 is determined as the reference volume, and the front-stage pressure sensor 214 is used as the pressure measurement unit, whereby a ROF type verifying method can be implemented, and there can be obtained a generally similar effect to that of the verifying system 100 in the first embodiment.

Referring to the ROF type verifying method in brief, in contrast to the ROR type verifying method in which a gas flow is introduced into the reference volume to thereby verify the mass flow controller based on an increased pressure inside the reference volume, in the ROF type method, firstly, a gas is stored in the reference volume and an influent flow gas line having a verify-targeted mass flow controller thereon is opened, and the verifying is executed based on the pressure decrement at this time. Specifically, after the pressure inside the reference volume is set to a prescribed value, the verifying gas line is opened and the reference volume is calculated based on the pressure decrement measured by the pressure measurement unit at this time. Subsequently, the pressure inside the reference volume is raised up to a prescribed value, and the influent flow gas line having the verify-targeted mass flow controller thereon is opened this time. Thus, the verifying parameter is calculated based on the pressure decrement measured by the pressure measurement unit at this time, and the reference parameter based on the reference volume is compared to the verifying parameter, thereby verifying the mass flow controller.

In this embodiment, although the comparing portion compares the value of the reference volume with the value of the calculated volume, the other type of the comparing portion may be also possible. For example, it may be possible that there has been previously stored a pressure increment value inside the reference volume after a predetermined time lapse from a time of setting a set flow rate, and the set flow rate is set in the verify-targeted mass flow controller so as to compare the pressure increment value after a predetermined time lapse. Also, it may be possible to judge whether the mass flow controller is normal or abnormal by comparing the time series data of the pressure measurement value with a verifying curve defined based on the reference volume.

In the above embodiment, although the secondary side valve is closed in order not to introduce a possible excessive gas flow into the reference volume, the reference volume may be determined by closing the valve inside the mass flow controller if the introduction of a gas flow is somewhat admissible. Also, the verifying gas line may be provided with a thermal mass flow controller and may be separately provided with the pressure measurement unit.

In the above embodiment, although the flow rate control is executed by setting a set flow rate so that a constant flow rate flows through the flow rate adjustable valve to thereby calculate the reference volume based on the pressure rise within the reference volume at this time, the flow rate adjustable valve is being opened and the reference volume may be obtained based on the pressure change at this time without setting the set flow rate if an accuracy is not highly required.

Further, it may be also possible that the verify-target mass flow controller is merely being opened without setting the set flow rate to flow a constant flow rate into the verify-targeted mass flow controller so as to verify the mass flow controller based on the pressure change at that time. In this case, it can be judged whether or not the mass flow controller is normal, by comparing the parameter calculated from the pressure change with the flow rate indicated by the flow rate measurement unit inside the verify-targeted mass flow controller, although a calibration (evaluation and the like) of the flow rate measurement unit cannot be executed.

In addition, not only the mass flow controller mentioned above but also the flow rate measurement unit (e.g., a mass flow meter or a flowmeter) separately provided from the mass flow controller on the influent flow gas line and so forth can be verified.

Further, the internal structure of the reference verify-targeted mass flow controller is not limited to the present embodiments as described above. For example, it may be possible that the flow rate measurement unit or pressure measurement unit is provided upstream of the flow rate adjustable valve.

In the above embodiments, although only one line of the verifying gas line is provided, a plurality of verifying gas lines may be provided.

Moreover, the reference volume is not limited to a closed space formed by totally closing the piping by the valves and so forth. For example, a fluid resistance such as a sonic nozzle in which a constant flow rate is kept flowing instead of the post-confluent valve is regarded as a closedown point, and if the pressure within the volume determined by the fluid resistance and so forth is raised or lowered, the ROR type or ROF type verifying can be executed.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

EXPLANATION OF REFERENCE NUMERALS

100 . . . verifying system
1 . . . mass flow controller
2 . . . differential mass flow controller
21 . . . flow rate measurement unit
22 . . . flow rate adjustable valve
211, 213 . . . pressure measurement unit
32 . . . reference volume calculating portion
33 . . . verifying parameter calculating portion
34 . . . comparing portion
GS . . . gas piping system
SL . . . influent flow gas line
ML . . . post-confluent flow gas line
MV . . . post-confluent valve
NL . . . pre-diverting flow gas line

What is claimed is:
1. A mass flow controller verifying system for use in a gas piping system provided with one or a plurality of influent flow gas lines each having a mass flow controller and provided with a post-confluent flow gas line into which a plurality of gas lines including the influent flow gas lines are joined and wherein the post-confluent flow gas line is provided with a post-confluent valve thereon after the confluence of the plurality of gas lines, said verifying system comprising:

a verifying gas line provided with a flow rate measurement unit adapted to measure a flow rate of a gas, a flow rate adjustable valve by which an opening degree thereof is adjusted so that the measurement flow rate measured by the flow rate measurement unit is coincident with a set flow rate, and a pressure measurement unit adapted to measure a gas pressure, wherein the verifying gas line is arranged in parallel to the influent flow gas lines and joined into the post-confluent flow gas line;

a reference volume calculating portion adapted to calculate a reference volume based on time series data of a measurement pressure measured by the pressure measurement unit, wherein the reference volume is a volume inside a piping portion determined by the flow rate adjustable valve, a closing position of each of the influent gas lines and the post-confluent valve, in a state that each of the influent gas lines is closed and the post-confluent valve is closed;

a verifying parameter calculating portion adapted to calculate a verifying parameter based on the time series data of the measurement pressure measured by the pressure measurement unit in a state that the influent gas lines, except for an influent gas line having a target mass flow controller to be verified, are closed at the same position as the closing position in the calculation of the reference volume, and that the adjustable valve and the post-confluent valve are closed; and a comparing portion adapted to compare a reference parameter set based on the reference volume and the verifying parameter.

2. The mass flow controller verifying system according to claim 1, wherein the verifying gas line is provided with a differential mass flow controller including the flow rate measurement unit, the flow rate adjustable valve and the pressure measurement unit, and wherein the pressure measurement unit is used as the flow rate measurement unit.

3. A mass flow controller verifying method for use in a gas piping system provided with one or a plurality of influent flow gas lines each having a mass flow controller and provided with a post-confluent flow gas line into which a plurality of gas lines including the influent flow gas lines are joined and wherein the post-confluent flow gas line is provided with a post-confluent valve thereon after the confluence of the gas lines, said verifying method comprising:

a step of installing a verifying gas line arranged in parallel to the influent flow gas lines and joined into the post-confluent flow gas line, wherein the verifying gas line is provided with a flow rate measurement unit adapted to measure a flow rate of a gas flowing through the verifying gas line, a flow rate adjustable valve by which an opening degree thereof is adjusted so that the measurement flow rate measured by the flow rate measurement unit is coincident with a set flow rate, and a pressure measurement unit adapted to measure a gas pressure in the verifying gas line;

a step of calculating a reference volume based on time series data of a measurement pressure measured by the pressure measurement unit, wherein the reference volume is a volume inside a piping portion determined by the flow rate adjustable valve, a closing position of each of the influent gas lines and the post-confluent valve, in a state that each of the influent gas lines is closed and the post-confluent valve is closed;

a step of calculating a verifying parameter based on the time series data of the measurement pressure measured by the pressure measurement unit in a state that the influent gas lines, except for an influent gas line having a target mass flow controller to be verified, are closed at the same position as the closing position in the calculation of the reference volume, and that the adjustable valve and the post-confluent valve are closed; and a step of comparing a reference parameter set based on the reference volume and the verifying parameter.

4. A computer readable program for executing a verifying of a mass flow controller in a gas piping system provided with one or a plurality of influent flow gas lines each having a mass flow controller and provided with a verifying gas line in parallel to the influent flow gas lines, wherein the verifying gas line is provided with a flow rate measurement unit adapted to measure a flow rate of a gas, a flow rate adjustable valve by which an opening degree thereof is adjusted so that the measurement flow rate measured by the flow rate measurement unit is coincident with a set flow rate, and a pressure measurement unit adapted to measure a gas pressure and wherein a post-confluent flow gas line located after the confluence of each of the influent gas lines and the verifying gas line is provided with a post-confluent valve thereon, the program executing the processes of:

calculating a reference volume based on time series data of a measurement pressure measured by the pressure measurement unit, wherein the reference volume is a volume inside a piping portion determined by the flow rate adjustable valve, a closing position of each of the influent gas lines and the post-confluent valve, in a state that each of the influent gas lines is closed and the post-confluent valve is closed;

calculating a verifying parameter based on the time series data of the measurement pressure measured by the pressure measurement unit in a state that the influent gas lines, except for an influent gas line having a target mass flow controller to be verified, are closed at the same position as the closing position in the calculation of the reference volume, and that the adjustable valve and the post-confluent valve are closed; and comparing a reference parameter set based on the reference volume and the verifying parameter.

\* \* \* \* \*